(12) United States Patent
Rack (10) Patent No.: US 6,433,270 B1
(45) Date of Patent: Aug. 13, 2002

(54) PHOTOINDUCED MOLECULAR SWITCHES

(75) Inventor: Jeffrey J. Rack, Los Alamos, NM (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/669,261

(22) Filed: Sep. 25, 2000

Related U.S. Application Data (60) Provisional application No. 60/156,023, filed on Sep. 23, 1999.

(51) Int. Cl.[7] .......................... C09K 9/02; C09K 11/06; G11C 13/04; C07F 15/00; H01L 51/30

(52) U.S. Cl. ....................... 136/263; 136/252; 136/256; 257/40; 257/103; 257/79; 257/431; 556/32; 556/42; 556/44; 556/45; 556/49; 556/57; 556/61; 556/136; 556/137; 556/138; 556/139; 556/146; 556/147; 250/336.1; 250/341.1; 250/200; 250/473.1; 250/474.1; 362/800

(58) Field of Search ................................ 136/252, 263, 136/256; 257/40, 103, 79, 431; 362/800; 556/32, 42, 44, 45, 49, 57, 61, 136, 137, 138, 139, 146, 147; 250/336.1, 341.1, 200, 473.1, 474.1

(56) References Cited

U.S. PATENT DOCUMENTS

| | | | |
|---|---|---|---|
| 5,393,903 A | 2/1995 | Grätzel et al. | ............... 556/137 |
| 6,245,988 B1 | 6/2001 | Grätzel et al. | ............... 136/263 |

FOREIGN PATENT DOCUMENTS

| | | | |
|---|---|---|---|
| JP | 62-201968 A | * | 9/1987 |
| WO | WO 98 50393 | | 11/1998 |
| WO | WO-98/50393 A1 | * | 11/1998 |

OTHER PUBLICATIONS

Rack et al, "Coordination of Dimethylsufoxide to Ruthenium: When is S–Bonding Favored Over O–Bonding?," Book of Abstracts, 217th ACS National Meeting, Anaheim, Mar. 21–25, 1999, INOR–673.*
Root et al, Inorg. Chem., 1985, 24, pp. 1464–1471.*
Tomita et al, "Linkage Isomerization of (Sulfoxide) ammineruthenium Complexes Induced by Electrochemical Processes," Inorg. Chem. 1994, 33, pp. 5825–5830.*
Pacheco et al, Inorg. Chem. 1995, 34, pp. 3477–3484.*
Geremia et al, Inorg. Chim. Acta, 253 (1996) pp. 87–90.*
Hagfeldt, et al., "Molecular Photovoltaics" *Acc. Chem. Res.* 33:269–277 (2000).
Rack, et al., "Spectroscopy and Electrochemistry of mer–RuCl3(dmso)(tmen). Dimethylsulfoxide Is Sulfur–Bonded to Ru(II), Ru(III), and Ru(IV)" *Inorg. Chem.* 38:2–3 (1999).
Sano, et al., "Preparations and Electrochemical Properties of Pyrazine–Bridged Ruthenium–Binuclear Complexes Exhibiting Molecular Hysteresis" *Inorg. Chem.* 39:200–205 (2000).
Agnew, et al., "Emission Spectra, Decay Times, and Polarization Ratios of Ruthenium(II) Complexes Containing Tridentate Ligands" *Chem. Phys. Lett.* 85:57–60 (1982).

(List continued on next page.)

*Primary Examiner*—Alan Diamond
(74) *Attorney, Agent, or Firm*—McCutchen, Doyle, Brown & Enersen, LLP; David W. Maher (57) ABSTRACT

ORGANOMETALLIC COORDINATION complexes exhibiting two separate, stable forms are described. Conversion from one form to the other is intramolecular, reversible, light-activated (a molecular switch) and occurs both in the solid and in solution. The two forms differ in photochemical and electrochemical characteristics (different colors and reduction potentials). The complexes can be used in information storage and for light-gathering, light-emitting, sensing and detecting applications.

43 Claims, 3 Drawing Sheets

OTHER PUBLICATIONS

Calligaris, et al., "Structure and Bonding in Metal Sulfoxide Complexes" *Coord. Chem. Rev.* 153:83–154 (1996).

Carducci, et al., "Diffraction Studies of Photoexcited Crystals: Metastable Nitrosyl–Linkage Isomers of Sodium Nitroprusside" *J. Am. Chem. Soc.* 119:2669–2678 (1997).

Damrauer, et al., "Femtosecond Dynamics of Excited–State Evolution in $[Ru(bpy)_3]^{2+}$" *Science* 275:54–57 (1997).

Daul, et al., "A Density Functional Study of the MLCT States of $[Ru(bpy)_3]^{2+}$ in $D_3$ Symmetry" *Inorg. Chem.* 33:3538–3543 (1994).

Felix, et al., "The Electronic Spectrum of $Ru(bpy)_3^{2+}$" *J. Am. Chem. Soc.* 102:4096–4102 (1980).

Fomitchev, et al., "Light–Induced Metastable Linkage Isomers of Transition Metal Nitrosyls" *Comments Inorg. Chem.* 21:131–148 (1999).

Hager, et al., "Charge–Transfer Excited States of Ruthenium(II) Complexes. II. Relationship of Level Parameters to Molecular Structure" *J. Am. Chem. Soc.* 97:7037–7042 (1975).

Hecker, et al., "Evidence for Dissociative Photosubstitution Reactions of $[Ru(trpy)(bpy)(NCCH_3)]^{2+}$. Crystal and Molecular Structure of $[Ru(trpy)(bpy)(py)]$ $PF_6)_2 \cdot (CH_3)_2CO$" *Inorg. Chem.* 30:659–666 (1991).

Imlau, et al., "Holographic Scattering in Centrosymmetric $Na_2[Fe(CN)_5NO] \cdot 2H_2O$" *Phys. Rev. Lett.* 82:2860–2863 (1999).

Imlau, et al., "Holographic recording by excitation of metastable electronic states in $Na_2[Fe(CN)_5NO]$; $2H_2O$: a new photorefractive effect" *Appl. Phys. B* 68:877–885 (1999).

Juris, et al., "Ru(II) Polypyridine Complexes: Photophysics, Photochemistry, Electrochemistry, and Chemiluminescence" *Coord. Chem. Rev.* 84:85–277 (1988).

Kirchoff, J.R., "Photochemistry and Photophysics of Bis-(terpyridyl) Complexes of Ru(II) in Fluid Solution. Evidence for the Formation of an $\mu^2$–Diphenylterpyridine Complex" *J. Am. Chem. Soc.* 107:1138–1141 (1985).

Kober, et al., "An Electronic Structural Model for the Emitting MLCT Excited States of $Ru(bpy)_3^{2+}$ and $Os(bpy)_3^{2+}$" *Inorg. Chem.* 23:3877–3886 (1984).

Low, et al., "Photoinduced Oxidation of Microperoxidase–8: Generation of Ferryl and Cation–Radical Porphyrins" *J. Am. Chem. Soc.* 118:117–120 (1996).

March, F.C., et al., "The Crystal Structure of Dimethylsulfoxidepentammineruthenium(II) Hexafluorophosphate" *Can. J. Chem.* 49: 3590–3595 (1971).

Pacheco, et al., "Synthesis and Characterization of (Octaethylporphyrinato)ruthenium(II) and –ruthenium(III) Complexes with Thioether, Sulfoxide, and Benzoate Axial Ligands", *Inorg. Chem.* 34:3477–3484 (1995).

Rack, et al., "Coordination of dimyethylsulfoxide to ruthenium: When is S–bonding Favored Over O–bonding?" retrieved from STN XP002159477 abstract & Book Abstracts, $217^{th}$ ACS National Meeting, Anaheim, Calif., Mar. 21–25 (1999), Inor–673. Publisher: American Chemical Society, Washington, D.C.

Roecker, et al., "Oxygen Atom Transfer in the Oxidations of Dimethyl Sulfide and Dimethyl Sulfoxide by $[(bpy)_2(py)Ru(O)]^{2+}$" *Inorg. Chem.* 26:779–781 (1987).

Root, et al., "Synthesis and Characterization of (bipyridine(terpyridine)(chalcogenoether)ruthenium(II) Complexes. Kinetics and Mechanism of the Hydrogen Peroxide Oxidation of $[(bpy)(tpy)RuS(CH_3)_2]^{2+}[(bpy)(tpy)RuS(O)(CH_3)_2]^{2+}$. Kinetics of the Aquation of $[(bpy)(tpy)RuS(O)(CH_3)_2]^{2+/}$" *Inorg. Chem.* 24:1464–71 (1985).

Sano, et al., "Molecular Hysteresis in an Electrochemical System Revisited" *Inorg. Chem.* 33:705–709 (1994).

Schon, et al., "Efficient organic photovoltaic diodes based on doped pentacene" *Letters to Nature* 403:408–410 (2000).

Senoff, et al., "Dimethylsulfoxidepentaammineruthenium(II) Hexafluorophosphate. A Spectroscopic Study" *Can. J. Chem.* 49:3585–3589 (1971).

Stone, et al., "Charge–Transfer Luminescence from Ruthenium(II) Complexes Containing Tridentate Ligands" *Chem. Phys. Lett.* 79:169–173 (1981).

Takeuchi, et al., "Redox and Spectral Properties of Monooxo Polypyridyl Complexes of Ruthenium and Osmium in Aqueous Media" *Inorg. Chem.* 23:1845–1851 (1984).

Tomita, et al., "Linkage Isomerization of (Sulfoxide) ammineruthenium Complexes Induced by Electrochemical Processes" *Inorg. Chem.* 33:5825–30 (1994).

Woike, et al., "New Information Storage Elements on the Basis of Metastable Elements on the Basis of Metastable Electronic States" *Optics Communications, NL, North–Holland Publishing Co.* 106:6–10 (1994).

Woike, et al., "Phase gratings in the visible and near–infrared spectral range realized by metastable electronic states in $Na_2(Fe(CN)_5NO \cdot 2H_2O$" *Appl. Phys. B* 63:243–248 (1996).

Wong, et al., "Yellow Light–Emitting Poly(phenylenevinylene) Incorporated with Pendant Ruthenium Bipyridine and Terpyridine Complexes" *Advanced Materials* 11:455–459 (1999).

Yeh, et al., "S to O and O to S Linkage Isomerization in Sulfoxide Complexes of Pentaammineruthenium" *Inorg. Chem.* 21:2542–2545 (1982).

International Search Report dated Feb. 16, 2001 for International Application No. PCT/US 00/26341 filed Sep. 25, 2000.

* cited by examiner

PHOTOINDUCED MOLECULAR SWITCHES

RELATED APPLICATION DATA

This application claims priority to provisional application Serial No. 60/156,023 filed Sep. 23, 1999, entitled "Photoinduced Molecular Switches for Information Storage and Sensing Applications."

GOVERNMENT SUPPORT

This work was supported by ARO (DAAH04-95-1-0125) and NIST (ATP) Award #70NANB5H1031.

TECHNICAL FIELD

The invention relates to organometallic coordination complexes that exhibit photoswitching behavior and their methods of use.

BACKGROUND OF THE INVENTION

A molecule that could act as a switch would be extremely useful for a variety of applications including information storage. A photochromic molecule having two or more forms could be used in binary (e.g., 0 or 1) or higher-order applications for optically storing bits of information. Furthermore, a photochromic molecule that also exhibited changes in electrochemical characteristics could be used as an optical interconnect or as a transducer to perform electrical/optical conversions.

A photochromic molecule could be used to detect and indicate the presence or introduction of light in an area in which light leakage was undesirable. If the photochromic change in the molecule corresponded to a change in reduction potential, the change in color could be monitored electrically from a remote location. This could be useful in security applications to signal a security breach.

A molecule that did exhibit a change in reduction potential upon irradiation could also be used in the field of solar energy. Such a complex could be used in dye-sensitized solar cells to absorb light and convert it into electricity.

Another way in which molecules can act as molecular switches is by changing color upon heating, or exhibiting thermochromic behavior. Thermochromic molecules can be used in applications similar to those in which photochromic molecules are used. Thermochromic molecules can be used to visually and/or electrically indicate that a certain temperature has been reached by monitoring a change in color and/or reduction potential. This type of indicator may be used to demonstrate exposure of heat-sensitive materials such as film and medicines to elevated temperatures.

Few examples exist of metal-containing molecules that exhibit switching behavior. Where it has been observed, switching has been observed almost exclusively in solution. These reactions are generally ground-state and are too slow for most applications. One example of a compound in which a photochromic change occurs as an excited-state reaction is sodium nitroprusside ($Na_2[Fe(CN)_5NO]$; "SNP"). Recent work has shown that photochromic sodium nitroprusside can be used for holographic information storage.[1-3] Crystallographic studies indicate that two metastable states of SNP are involved: the first (MS I) is an isonitrosyl (O— bonded NO), whereas the second (MS II) is an $\eta^2$-NO (side-on) complex.[4,5] However, the metastable states in SNP can only be observed at low temperature (<100 K) and thus are of limited utility.

Although many devices such as semiconductors already exist for information storage, molecules have not previously been used for this task. The advantage of using molecules is most apparent in optical computing applications. The primary advantage of using molecules is in information density. The small size of molecules would permit more information to be stored per unit volume.

SUMMARY OF THE INVENTION

The design of molecular coordination complexes exhibiting two separate, stable forms is described. Reaction from one form to the other is intramolecular, reversible, light-activated (a molecular switch) and occurs both in the solid and in solution. The two forms differ in photochemical and electrochemical characteristics, having different colors and reduction potentials. These differences allow use of such complexes in information storage and for sensing and detecting applications.

Accordingly, it is a primary object of the invention to provide novel metastable organometallic coordination complexes comprising an imine-containing ligand and a photoisomerizable ligand, along with additional ligands to complete the complex. Upon photoexcitation, an electron is passed from the metal to the imine-containing ligand via metal to ligand charge transfer; the photoisomerizable group also photoisomerizes and changes its bonding mode to the metal in the photoexcited state. The photoexcited state then decays to a metastable state exhibiting altered electrical and optical characteristics.

It is another object of the invention to provide articles comprising such complexes. The complexes can be incorporated into a polymer, which can be a semiconducting organic polymer. This incorporation can either provide or alter light emission from the polymer upon passing electricity through the polymer. The complexes can be incorporated into light-emitting diodes, optical interconnects, in transducers, and in dye-sensitized solar cells.

It is still another object of the invention to provide methods for using such complexes or the ground state of such complexes. The complexes can be utilized in detection methods to detect the presence of light; photoisomerization of the complex can be detected either optically or electrically. The complexes can also be used in methods of data storage and retrieval. A light source can be directed to an addressed location comprising the complex to photoexcite it and thereby store a bit of information in its metastable ground state. That information can be retrieved either optically or electrically by sampling for a change in the complex resulting form photoexcitation. The complexes can also be used in thermal applications to detect changes in temperature by any increase in decay of the metastable state to the ground state, which can also be detected by changes in color or reduction potential.

Additional objects, advantages and novel features of the invention will be set forth in part in the description which follows, and in part will become apparent to those skilled in the art upon examination of the following, or may be learned by practice of the invention.

DETAILED DESCRIPTION OF THE INVENTION

Photoisomerizable organometallic coordination complexes capable of acting as molecular photoswitches are provided. Also provided are photoexcited complexes exhibiting different chromatic, thermochromatic and/or electrical properties than the ground-state complexes. Also provided are polymers, light-emitting diodes and dye-sensitized solar cells comprising such complexes. Methods of using such complexes to gather, sense, emit and detect light contact or heating are also provided.

The organometallic coordination complexes of the invention exhibit photoinduced linkage isomerism. Upon excitation into a MLCT (Metal-to-Ligand Charge-Transfer) absorption band, the metal in a low oxidation state is oxidized and a ligand is reduced in an excited-state (ES). During the lifetime of this complex, another ligand bound to the metal atom isomerizes while remaining bound to the metal complex, thereby forming ES I. Relaxation of this excited state (ES I) forms a metastable state (MS I) exhibiting different optical and/or electrical properties. This metastable state then slowly reverts to the ground-state (GS) complex, either thermally or photochemically.

The reactivity of this system is due to the oxidation state of the metal atom and its interaction with the isomerizing ligand. In the reduced state, the metal atom prefers to bind to one atom, whereas in the oxidized state, the metal atom prefers to interact with a second atom or functionality. The oxidized state is reached through irradiation into an MLCT absorption band. Thus, this reactivity may be expected in a variety of complexes both in the ground-state or in the excited-state. The prerequisites for this reactivity are the presence of an MLCT absorption band and a ligand exhibiting linkage isomerism.

Before the present invention is described in detail, it is to be understood that this invention is not limited to the particular complexes, methods or articles described, as such complexes, methods or articles can, of course, vary. It is also to be understood that the terminology used herein is for the purpose of describing particular embodiments only, and is not intended to limit the scope of the present invention.

Use of the singular forms "a," "an," and "the" include plural references unless the context clearly dictates otherwise. Thus, for example, reference to "a molecular photoswitch" includes a plurality of molecular photoswitches, reference to "an organic polymer" includes a plurality of such polymers, reference to "a substituent" includes a plurality of substituents, and the like.

As used herein, terms such as "connected," "attached" and "linked" encompass direct or indirect connection or attachment, unless context dictates otherwise. Where a numerical range of values is recited, it is to be understood that each intervening value, to the tenth of the unit of the lower limit of that range where fractions are possible, between the recited upper and lower limits of that range is also specifically disclosed, unless the context clearly dictates otherwise. Each smaller range between any recited value or intervening value in a recited range and any other recited or intervening value in that recited range is encompassed within the invention. The upper and lower limits of these smaller ranges can independently be included in or excluded from the range, and each range where either, neither or both limits are included in the smaller range is also encompassed within the invention. Where the recited range includes one or both of the limits, ranges excluding either or both of those included limits are also within the scope of the invention. Where the value being discussed has inherent limits, for example where a component can be present at a concentration of from 0 to 100%, or where the pH of an aqueous solution can range from 1 to 14, those inherent limits as well as any intervening value between an inherent limit and any recited value are specifically disclosed, along with ranges defined by any such value or limit, as described above. Where a value is explicitly recited, it is to be understood that values which are about the same quantity or amount as the recited value are also within the scope of the invention. All possible combinations of the alternatives for each individual element making up the various embodiments of the invention, including all combinations excluding one or more of the alternatives for each element, are specifically disclosed.

Unless defined otherwise or the context clearly dictates otherwise, all technical and scientific terms used herein have the same meaning as commonly understood by one of ordinary skill in the art to which this invention belongs. Although any methods and materials similar or equivalent to those described herein can be used in the practice or testing of the invention, the preferred methods and materials are now described.

All publications mentioned herein are hereby incorporated by reference for the purpose of disclosing and describing the particular materials and methodologies for which the reference was cited. The publications discussed herein are provided solely for their disclosure prior to the filing date of the present application. Nothing herein is to be construed as an admission that the invention is not entitled to antedate such disclosure by virtue of prior invention.

DEFINITIONS

"Alkyl" refers to a branched, unbranched or cyclic saturated hydrocarbon group of 1 to 24 carbon atoms optionally substituted at one or more positions. Examples of alkyl groups include methyl, ethyl, n-propyl, isopropyl, n-butyl, s-butyl, t-butyl, n-amyl, isoamyl, n-hexyl, n-heptyl, n-octyl, n-decyl, hexyloctyl, tetradecyl, hexadecyl, eicosyl, tetracosyl and the like, as well as cycloalkyl groups such as cyclopropyl, cyclobutyl, cyclopentyl, cyclohexyl, cycloheptyl, cyclooctyl and the like. The term "lower alkyl" refers to an alkyl group of 1 to 6 carbon atoms, preferably 1 to 4 carbon atoms. Exemplary substituents on substituted alkyl groups include hydroxyl, cyano, alkoxy, =O, =S, —NO$_2$, halogen, haloalkyl, heteroalkyl, amine, thioether and —SH.

"Alkoxy" refers to an "—Oalkyl" group, where alkyl is as defined above. A "lower alkoxy" group intends an alkoxy group containing one to six, more preferably one to four, carbon atoms.

"Alkenyl" refers to a branched, unbranched or cyclic hydrocarbon group of 2 to 24 carbon atoms containing at least one carbon-carbon double bond optionally substituted at one or more positions. Examples of alkenyl groups include ethenyl, 1-propenyl, 2-propenyl (allyl), 1-methylvinyl, cyclopropenyl, 1-butenyl, 2-butenyl, isobutenyl, 1,4-butadienyl, cyclobutenyl, 1-methylbut-2-enyl, 2-methylbut-2-en-4-yl, prenyl, pent-1-enyl, pent-3-enyl, 1,1-dimethylallyl cyclopentenyl, hex-2-enyl, 1-methyl-1-ethylallyl, cyclohexenyl, heptenyl, cycloheptenyl, octenyl, cyclooctenyl, decenyl, tetradecenyl, hexadecenyl, eicosenyl, tetracosenyl and the like. Preferred alkenyl groups herein contain 2 to 12 carbon atoms. The term "lower alkenyl" intends an alkenyl group of 2 to 6 carbon atoms, preferably 2 to 4 carbon atoms. The term "cycloalkenyl" intends a cyclic alkenyl group of 3 to 8, preferably 5 or 6, carbon atoms. Exemplary substituents on substituted alkenyl groups include hydroxyl, cyano, alkoxy, =O, =S, —NO$_2$, halogen, haloalkyl, heteroalkyl, amine, thioether and —SH.

"Alkenyloxy" refers to an "—Oalkenyl" group, wherein alkenyl is as defined above.

"Alkylaryl" refers to an alkyl group that is covalently joined to an aryl group. Preferably, the alkyl is a lower alkyl. Exemplary alkylaryl groups include benzyl, phenethyl, phenopropyl, 1-benzylethyl, phenobutyl, 2-benzylpropyl and the like.

"Alkylaryloxy" refers to an "—Oalkylaryl" group, where alkylaryl is as defined above.

"Alkynyl" refers to a branched or unbranched hydrocarbon group of 2 to 24 carbon atoms containing at least one —C≡C— bond, optionally substituted at one or more positions. Examples of alkynyl groups include ethynyl, n-propynyl, isopropynyl, propargyl, but-2-ynyl, 3-methylbut-1-ynyl, octynyl, decynyl and the like. Preferred alkynyl groups herein contain 2 to 12 carbon atoms. The term "lower alkynyl" intends an alkynyl group of 2 to 6, preferably 2 to 4, carbon atoms, and one —C≡C— bond. Exemplary substituents on substituted alkynyl groups include hydroxyl, cyano, alkoxy, =O, =S, —NO$_2$, halogen, haloalkyl, heteroalkyl, amine, thioether and —SH.

"Amide" refers to —C(O)NHR, where R is alkyl, aryl, alkylaryl or hydrogen.

"Amine" refers to an —N(R')R" group, where R' and R" are independently selected from hydrogen, alkyl, aryl, and alkylaryl.

"Aryl" refers to an aromatic group which has at least one ring having a conjugated pi electron system and includes carbocyclic, heterocyclic and polycyclic aryl groups, and can be optionally substituted at one or more positions. Typical aryl groups contain 1 to 5 aromatic rings, which may be fused and/or linked. Exemplary aryl groups include phenyl, furanyl, azolyl, thiofuranyl, pyridyl, pyrimidyl, pyrazinyl, triazinyl, indenyl, benzofuranyl, indolyl, naphthyl, quinolinyl, isoquinolinyl, quinazolinyl, pyridopyridinyl, pyrrolopyridinyl, purinyl, tetralinyl and the like. Exemplary substituents on optionally substituted aryl groups include alkyl, alkoxy, alkylcarboxy, alkenyl, alkenyloxy, alkenylcarboxy, aryl, aryloxy, alkylaryl, alkylaryloxy, fused saturated or unsaturated optionally substituted rings, halogen, haloalkyl, heteroalkyl, —S(O)R, sulfonyl, —SO$_3$R, —SR, —NO$_2$, —NRR', —OH, —CN, —C(O)R, —OC(O)R, —NHC(O)R, —(CH2)$_n$CO$_2$R or —(CH2)$_n$CONRR' where n is 0–4, and wherein R and R' are independently H, alkyl, aryl or alkylaryl.

"Aryloxy" refers to an "—Oaryl" group, where aryl is as defined above.

"Carbocyclic" refers to an optionally substituted compound containing at least one ring and wherein all ring atoms are carbon, and can be saturated or unsaturated.

"Carbocyclic aryl" refers to an optionally substituted aryl group wherein the ring atoms are carbon.

"Halo" or "halogen" refers to fluoro, chloro, bromo or iodo, and usually relates to halo substitution for a hydrogen atom in an organic compound. Of the halogens, chloro and fluoro are generally preferred.

"Haloalkyl" refers to an alkyl group substituted at one or more positions with a halogen, and includes alkyl groups substituted with only one type of halogen atom as well as alkyl groups substituted with a mixture of different types of halogen atoms. Exemplary haloalkyl groups include trihalomethyl groups, for example trifluoromethyl.

"Heteroalkyl" refers to an alkyl group wherein one or more carbon atoms and associated hydrogen atom(s) are replaced by an optionally substituted heteroatom, and includes alkyl groups substituted with only one type of heteroatom as well as alkyl groups substituted with a mixture of different types of heteroatoms. Heteroatoms include oxygen, sulfur, and nitrogen. As used herein, nitrogen heteroatoms and sulfur heteroatoms include any oxidized form of nitrogen and sulfur, and any form of nitrogen having four covalent bonds including protonated forms. An optionally substituted heteroatom refers to replacement of one or more hydrogens attached to a nitrogen atom with alkyl, aryl, alkylaryl or hydroxyl.

"Heterocyclic" refers to a compound containing at least one saturated or unsaturated ring having at least one heteroatom and optionally substituted at one or more positions. Typical heterocyclic groups contain 1 to 5 rings, which may be fused and/or linked, where the rings each contain five or six atoms. Examples of heterocyclic groups include piperidinyl, morpholinyl and pyrrolidinyl. Exemplary substituents for optionally substituted heterocyclic groups are as for alkyl and aryl at ring carbons and as for heteroalkyl at heteroatoms.

"Heterocyclic aryl" refers to an aryl group having 1 to 4 heteroatoms in one or more aromatic rings, the remainder of the ring atoms being carbon. Exemplary heterocyclic aryl groups include furanyl, thienyl, pyridyl, pyridazinyl, pyrrolyl, N-lower alkyl-pyrrolo, pyrimidyl, pyrazinyl, triazinyl, tetrazinyl, triazolyl, tetrazolyl, imidazolyl, bipyridyl, tripyridyl, tetrapyridyl, phenazinyl, phenanthrolinyl, purinyl and the like.

"Hydrocarbyl" refers to hydrocarbyl substituents containing 1 to about 20 carbon atoms, including branched, unbranched and cyclic species as well as saturated and unsaturated species, for example alkyl groups, alkylidenyl groups, alkenyl groups, alkylaryl groups, aryl groups, and the like. The term "lower hydrocarbyl" intends a hydrocarbyl group of one to six carbon atoms, preferably one to four carbon atoms.

"Optional" or "optionally" means that the subsequently described event or circumstance may or may not occur, and that the description includes instances where said event or circumstance occurs singly or multiply and instances where it does not occur at all. For example, the phrase "optionally substituted alkylene" means an alkylene moiety that may or may not be substituted and the description includes both unsubstituted, monosubstituted, and polysubstituted alkylenes.

A "substituent" refers to a group that replaces one or more hydrogens attached to a carbon or nitrogen. Exemplary substituents include alkyl, alkylidenyl, alkylcarboxy, alkoxy, alkenyl, alkenylcarboxy, alkenyloxy, aryl, aryloxy, alkylaryl, alkylaryloxy, —OH, amide, carboxamide, carboxy, sulfonyl, =O, =S, —NO$_2$, halogen, haloalkyl, fused saturated or unsaturated optionally substituted rings, —S(O)R, —SO$_3$R, —SR, —NRR', —OH, —CN, —C(O)R, —OC(O)R, —NHC(O)R, —(CH2)$_n$CO$_2$R or —(CH2)$_n$CONRR' where n is 0–4, and wherein R and R' are independently H, alkyl, aryl or alkylaryl. Substituents also include replacement of a carbon atom and one or more associated hydrogen atoms with an optionally substituted heteroatom.

"Sulfonyl" refers to —S(O)$_2$R, where R is aryl, —C(CN)=C-aryl, —CH$_2$CN, alkylaryl, or amine.

"Thioamide" refers to —C(S)NHR, where R is alkyl, aryl, alkylaryl or hydrogen.

"Thioether" refers to —SR, where R is alkyl, aryl, or alkylaryl.

THE ORGANOMETALLIC COORDINATION COMPLEX OF THE INVENTION

The invention provides a complex of the formula

M is a metal atom capable of transferring a charge upon absorption of light, referred to as a metal-to-ligand charge-transfer ("MLCT") absorption. An MLCT absorption is typically characterized by its intensity (molar absorptivity coefficient ranges from $10^3$ to $10^4$ M$^{-1}$ cm$^{-1}$) and solvatochromism (peak maximum shifts as a function of solvent). M is preferably selected from V, Cr, Mo, W, Mn, Tc, Re, Fe, Ru, Os, Co, Rh, Ir, Ni, Pd, and Pt.

I is an "imine"-containing ligand comprising at least one C=N—R$_I$ group and coordinated with M through the free electron pair on the nitrogen, wherein R$_I$ comprises a carbon, nitrogen, oxygen or hydrogen atom bound to the imine nitrogen, and includes heteroaryl and unsaturated heteroalkyl groups. Preferred embodiments of I include five- and six-membered heteroaryl rings optionally substituted at one or more positions which may be fused or linked to one to four additional five- or six-membered optionally substituted aryl and/or heteroaryl rings, for example pyridine, pyridazine, pyrimidine, purine, phenanthroline, phenazine, pyrrole, bipyridyl, terpyridyl, tetrapyridyl, N-lower alkyl-pyrrole, triazole, tetrazole, triazine, tetrazine and pyrazine. Also preferred are those embodiments of I where I is combined with one or two of X$_1$, X$_2$, X$_3$ and X$_4$ to form a bidentate or terdentate ligand. Preferred bidentate ligands include optionally substituted bipyridyl and 1,10-phenanthroline, and preferred terdentate ligands include optionally substituted terpyridyl. Suitable substituents on optionally substituted I groups or combined embodiments in which I forms bidentate or terdentate ligands include substituents as defined above; preferred substituents are those defined as exemplary substitutents on aryl groups when I is a heteroaryl group.

L is an isomerizable ligand containing an isomerizable group comprising at least two functionalities capable of bonding to M. The two functionalities can be two atoms having a free electron pair capable of forming a complex with M, for example N, O, S, C, or Se, or one of the functionalities can be an unsaturated bond between one of the atoms and another atom. Exemplary L ligands include the groups S(O), SO$_2$, C(O), CO$_2$, C(S), CS$_2$, C(Se), CSe$_2$, and NO either as free species or incorporated into larger molecules. L includes molecules comprising a carboxylate group, a thiocarboxylate group, an oxalate group, a thiooxalate group, a carboxamide group, a thiocarboxamide group, and a sulfonyl group. L includes nitroso-substituted aryl groups, and nitroso-substituted-nitrogen-containing compounds. L can have the structure R—Y—R', wherein Y is the isomerizable group and is selected from S(O), C(O), C(S), and C(Se), and wherein R and R' are independently selected from H, alkyl, heteroalkyl, aryl, alkylaryl, or one of R and R' can be not present, or wherein R and R' can be combined to form a cyclic group, or wherein R and/or R' can be independently linked to I and/or one or more of X$_1$, X$_2$, X$_3$ and X$_4$. Exemplary L ligands include dimethylsulfoxide, acetone, aminoethylmethylsulfoxide.

X$_1$, X$_2$, X$_3$ and X$_4$ are independently selected from ligands that form a coordination complex with the metal M, said ligands being monodentate or being optionally linked or fused to each other and/or to I and/or L to form one or more didentate or terdentate ligands or a tetradentate ligand, or two of X$_1$, X$_2$, X$_3$ or X$_4$ may be not present where M is tetracoordinate. Any ligand that can form a coordination complex with M in the presence of I and L can be used for X$_{1-4}$. Exemplary ligands for X$_{1-4}$ include any ligand or atom that is bound to M through an atom selected from C, N, O, Si, P, S, Cl, Ge, As, Se, Br, Sn, Sb, Te, or I, including straight chain, branched and cyclic compounds, and can be aliphatic or aromatic.

The ligands I, L, X$_1$, X$_2$, X$_3$ and X$_4$ can be complexed to the metal M in any orientation, and the structure includes all isomers of the complex. Nothing in the orientation of the bonds as drawn is meant to imply anything about the stereochemistry of the complex.

The complex has a ground state, at least one photoexcited state, and at least one metastable state having different electrical and/or optical properties that can be reached via photoexcitation. Different ligands or combinations of ligands and different substituents on the optionally substituted imine ligand can be used to tune the absorption and/or emission of the complex. To determine if a given complex is photoisomerizable, an absorption spectra of the complex can be first determined. A light source emitting in a region at which the complex absorbs can be used to contact the complex and photoexcite it. Preferably the light source is monochromatic, for example a laser. The resulting complex can then be assayed for a change in its emission spectrum and for a change in its reduction potential. Photoisomerization will produce a characteristic change in at least one of these features.

The complex of the invention can be used as a solid, in solution, or entrapped or synthesized within a polymer. A solid form of the complex can be prepared in crystalline form, and can be prepared by any available means, for example by crystallization from solution, or by vapor deposition. Solutions of the complex can be prepared by dissolving the complex in a solvent; determination of suitable solvents is within the skill of the art.

To prepare polymers containing the complex, the complex can be dissolved in or with the monomers that will form the polymer prior to polymerization, or the complex may contain a substituent, for example a vinyl group, that allows for the physical incorporation of the complex into the polymer itself. Where the complex is not soluble in the unpolymerized monomer, a solvent compatible with the polymer may be used to first dissolve the complex, and that solution can then be mixed with the monomer before forming the polymer. The complex can also be coated onto the surface of the polymer. Nonlimiting examples of polymers which can be combined with the complex include polymethylmethacrylate, polystyrene, polyethylene, polycarbonate, and poly(lactate-glycolic acid). The combined polymer and complex can be formed into any shape, for example tubes, solids, fibers, beads, porous and nonporous microspheres and films.

The complex can be used in a variety of applications either alone or combined with a polymer. The complex can be incorporated into a polymeric photoswitch which can be photoexcited by a light source, which photoexcitation can be detected electrically. The complex can be incorporated into an optical interconnect or a transducer to convert a light signal to an electrical impulse.

The complex can be combined with a semiconducting organic polymer in an organic light-emitting diode ("LED"). The complex can be chemically incorporated into the polymer, or can be mixed with the semiconducting polymer prior to polymerization, or can be deposited as a layer adjacent to the semiconducting polymer, and may alter the light normally emitted by the polymer or may cause a non-emitting polymer to emit light. The polymer can be deposited by spin-coating. Nonlimiting examples of organic polymers which may be used include polyphenylene, polypyridine, polythiophene, polypyrrole, poly(pyridine vinylene), and poly(phenylene vinylene). The semiconducting polymer is attached to two electrodes that supply current.

The complex can also be used in dye-sensitized solar cells (Schon et al., Nature 403:408, 2000). The complex can be incorporated into the photovoltaic layer, which can be optionally doped with one or more electron-accepting molecules to improve its efficiency. Suitable doping agents include halides or mixtures of halides, for example bromine, iodine, or a mixture of bromine and iodine. The photovoltaic layer is placed between front and back contacts that can conduct electricity produced by the cell upon photoexcitation.

Applications which make use of both the optical and electrical properties of the complex can beneficially employ transparent electrodes in many instances. Any electrodes providing suitable electrical performance and transparent at the desired wavelengths can be used. Suitable transparent electrodes can be prepared from indium-tin-oxide. Metal contacts can be deposited on such electrodes, such as silver, aluminum or magnesium.

In many applications of the complex, a light source is used to photoexcite the complex. Any light source which can photoexcite the complex and thereby access the metastable state can be used in such applications. In some instances it will be useful to utilize a narrow spectrum excitation source, such as a laser. In other instances a broad spectrum excitation source can be used.

The metastable state of the complex produced after photoexcitation exhibits different optical properties (color) and/or different electrical properties (reduction potential). Applications calling for detection of the metastable state can employ detectors that detect either or both of these changes in the complex. Optical detectors detect the wavelength of light emitted or reflected from the complex, and can be separate from the complex or can be integrally formed with the complex, for example deposited on the end of a fiber optic cable. Electrical detectors are typically coupled to the complex so that they can electrically sense the change in reduction potential in the metastable state, although a scanning electrode could also be used.

Many of the applications of the complex utilize the metastable state which is accessed through photoexcitation. These methods thus all involve directing a light source at the ground state complex to photoisomerize the ligand L and thus alter the optical and/or electrical properties of the complex. The particular metastable complex utilized may exhibit changes in only its optical properties, only its electrical properties, or both, and the detection method used must account for this.

The complex can also be used for the optical storage of information. A light source can be directed to an area containing the complex and thereby deposit a bit of information. That information can then be recovered electrically or optically. Where the complex is one that decays from its metastable state to the ground state during the timespan of operation of the particular device, the information storage can be refreshed by again directing the light source onto the area.

The complex can also be incorporated into a security system. The complex can be placed in an area such that entry into the area causes a light source to strike the complex. A detection device can be used to determine if the optical or electrical properties of the complex have changed due to photoisomerization of the complex after contact with the light source. This can allow remote detection of a breach of security in that area.

Decay of the metastable state to the ground state is a thermal process, and the complex thus exhibits thermochromicity. This decay process can vary with temperature. Elevated temperatures can accelerate the decay process, and lowered temperatures can slow this process. The particular amount of heat necessary to accelerate this decay will vary with the composition of the complex, and can be determined empirically for a given complex. With knowledge of the decay rate under a given set of thermal conditions, this property of the complex can be used to determine if the complex was exposed to a higher temperature than that set of thermal conditions. This can be used by placing a "recorder" comprising the complex together with a thermally sensitive material, such as film or medicine. The recorder can later be assayed optically and/or electrically to determine the amount of decay of the complex from the metastable state to the ground state, and thus determine whether exposure to elevated temperature has occurred. For the complex described in Example 1, decay in the solid state at room temperature is slow, and is not accelerated at 85° F., but can be slowed upon cooling, and thus be used to demonstrate exposure of a refrigerated or frozen substance to elevated temperatures.

EXAMPLES

Example 1

Characterization of [Ru(tpy)(bpy)(dmso)][(OTf)$_2$]

The salt, [Ru(tpy)(bpy)(dmso)][(OTf)$_2$](tpy is 2,2'6', 2"-terpyridine; bpy is 2,2'-bipyridine; dmso is dimethylsulfoxide; OTf is trifluoromethanesulfonate) was prepared through reaction of [Ru(tpy)(bpy)(H$_2$O)][(OTf)$_2$] (literature procedure) and dimethylsulfoxide in ethanol, and was characterized by X-ray crystallography and electrochemistry, as well as by absorption and emission spectroscopy.

In solution (acetone, tetrahydrofuran, dmso), 430–450 nm irradiation of [Ru(tpy)(bpy)(dmso)]$^{2+}$ produces a new species with an absorption maximum at 490 nm.[17] The spectrum, which is reminiscent of those observed for products formed in reactions of (CH$_3$)$_2$S with [(tpy)(bpy) Ru$^{IV}$=O][11] and [(bpy)2(py)Ru$^{IV}$=O] (py is pyridine),[18] is consistent with O-bonded Ru-dmso. The photoinduced reaction occurs rapidly ($\leq$150 nanoseconds). The photoproduct exhibits similar absorption characteristics in numerous solvents. The red product does not revert to the starting material unless in the presence of dmso; thus, the photoinduced reaction is irreversible in solution. Emission spectroscopy reveals two features at 720 and 810 nm in nonhalogenated solvents.

Exposure of the solid to 441.6 nm light produces an emission spectrum identical to that observed in solution, namely peaks at 720 and 810 nm. Further, the irradiated sample turns from orange to a deep-red. The orange color returns after a period of minutes. The cycle can be repeated on the same spot numerous times (>50); evidence for decomposition has not been observed. At room temperature only one decay process from the photoexcited state is seen; that process is depicted in the Em I decay process shown in FIG. 3. The metastable O-bound dmso product produced in this decay process differs in color and reduction potential from the ground state compound.

Figure 3:
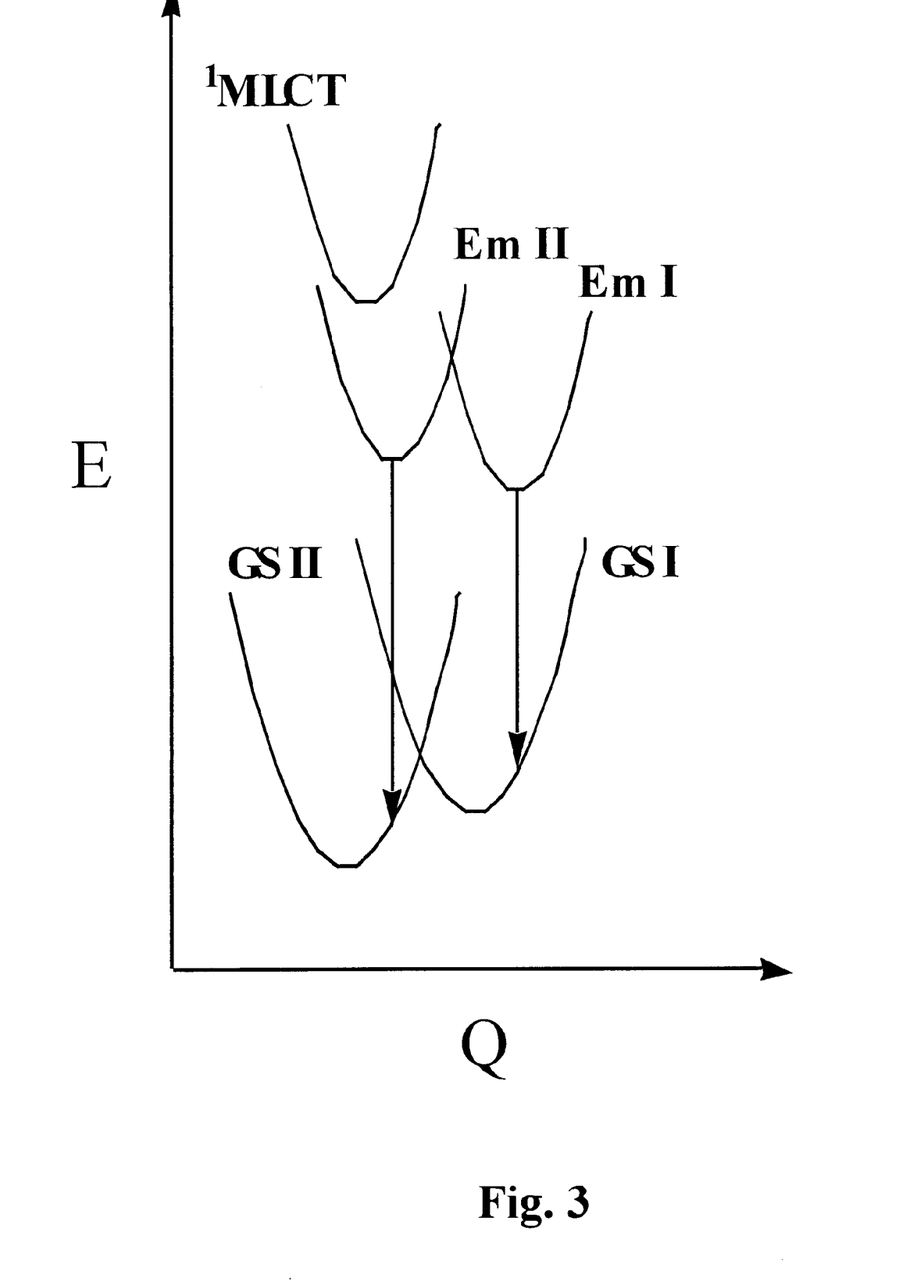
FIG. 3. Excitation of [Ru(tpy)(bpy)(dmso)]$^{2+}$ produces $^1$MLCT, which decays rapidly (<10 ns) to Em I and Em II. Em II->GS II, 625 nm; Em I->GS I, 710 nm. I contains O-bonded dmso.

The reaction sequence for Em I decay in the solid state is shown below. Excitation into the MLCT band at 410 nm, produces the reduced-ligand excited state (reaction 1). During the lifetime of this complex, dmso isomerizes from an S-bound (dmSo) state to an O-bound (dmsO) dmso complex (reaction 2). Following isomerization, relaxation to a metastable state is observed (reaction 3). The last sequence (reaction 4) shows the thermal reaction from the metastable state (O-bound) to the S-bound starting material.

At reduced temperatures in the solid state a second decay process is also seen, as depicted in the Em II decay process in FIG. 3. This reaction sequence is shown below. Excitation into the MLCT band at 410 nm, produces the reduced-ligand excited state (reaction 1). During the lifetime of this complex, dmso isomerizes from an S-bound (dmSo) state to what is believed to be an $\eta^2$-bound (dmSO) dmso complex (reaction 2). This bonding nomenclature suggests that fly each atom (S, O) is equidistant from the ruthenium atom, and that each atom is bonded equally to the ruthenium atom. Following isomerization, relaxation to a metastable state is observed (reaction 3). This state is characterized by an MLCT absorption band and a reduction potential different from that observed for the S-bound starting material. The last sequence (reaction 4) shows the thermal reaction from the metastable state ($\eta^2$-bound) to the S-bound starting material.

Figure 1:
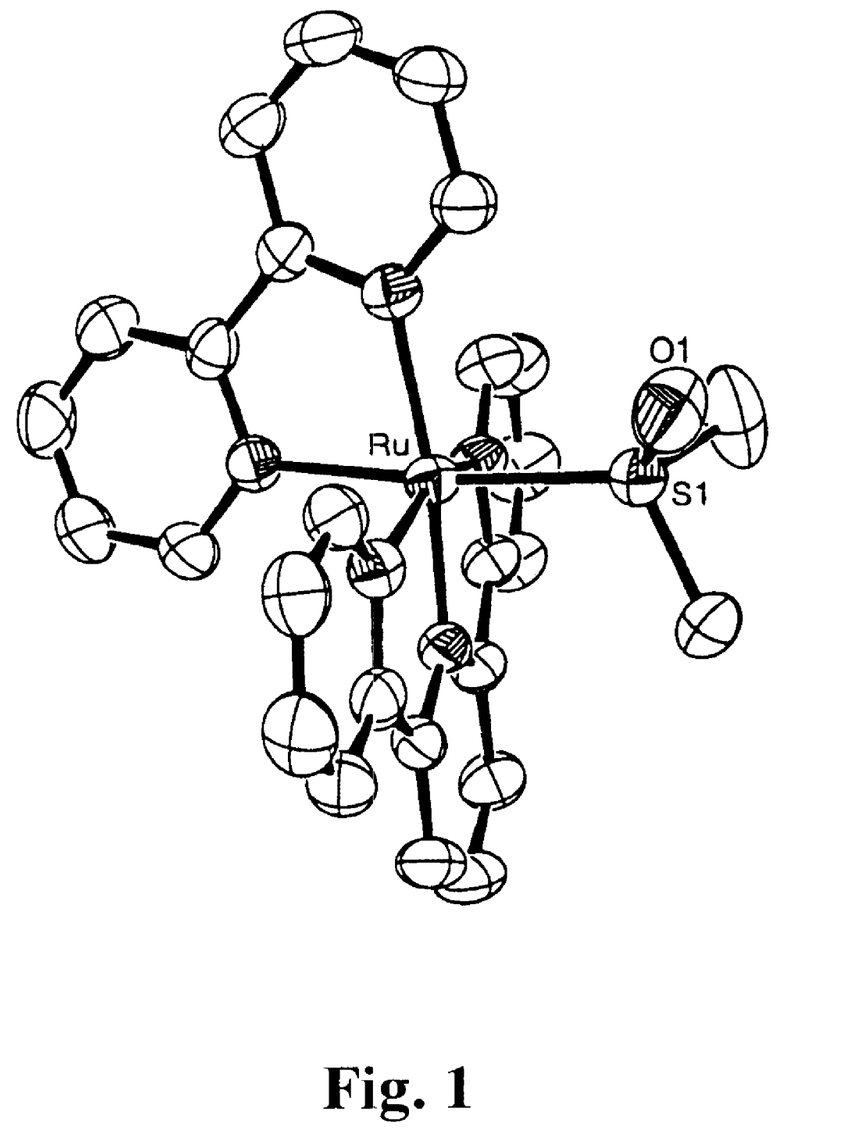
FIG. 1. Structure of $[Ru(tpy)(bpy)(dmso)]^{2+}$. Selected distances (Å) and bond angles (°): Ru—S, 2.2821(10); S—O 1.476(3); Ru—N(2), 1.975(3); Ru—N(3), 2.073(3); Ru—N(1) 2.079(3); Ru—N(5), 2.084(3); Ru—N(4), 2.100(3); N(5)-Ru—S(1), 174.03(9), O(1)-S(1)-Ru, 115.70(12).

X-ray crystallography was performed on crystals of [Ru(tpy)(bpy)(dmso)]$^{2+}$ in order to characterize the complex. Crystal structure analysis[9] of [Ru(tpy)(bpy)(dmso)]$^{2+}$ (FIG. 1) gives Ru—S and S—O distances of 2.2821(10) and 1.4672(26) Å, respectively (vs. 1.492(2) Å S—O distance for free dmso).[10] An increase in the S=O bond strength inferred from IR data ($v(SO)$=1102 cm$^{-1}$;[11] uncomplexed dmso: $v(SO)$=1055 cm$^{-1}$),[12] is typical of S-bonded Ru-dmso complexes.[13] Despite the short S—O distance and the relatively high stretching frequency, the blue-shifted MLCT band (CH$_3$CN: 412 nm, 24,390 cm$^{-1}$; $\epsilon$=8080 M$^{-1}$ cm$^{-1}$) relative to that of [Ru(tpy)(bpy)(CH$_3$CN)]$^{2+}$ (CH$_3$CN: 454 nm, 22,030 cm$^{-1}$; $\epsilon$=10,900 M$^{-1}$ cm$^{-1}$)[14] indicates that Ru(II) is stabilized by d$\pi$->dmso backbonding.

Cyclic voltammograms of [Ru(tpy)(bpy)(dmso)]$^{2+}$ reveal two irreversible electron-transfer processes.[11] Analysis based on an ECEC mechanism indicates that the Ru(III/II) reduction potential in the S-bonded complex is 1.84 V vs. NHE.[15] This potential is approximately 600 mV more positive than that of [Ru(bpy)3]$^{3+/2+}$ (E°=1.25 V),[16] in accord with Ru(II) stabilization by dmso. A lower-potential couple, only observed following oxidation at 1.84 V, is at 1.32 V vs. NHE. By analogy to earlier work,[6,7] it is believed that S-to-O isomerization accompanies oxidation of [Ru(tpy)(bpy)(dmso)]$^{2+}$. Based on simulations of the voltammograms, the rates of isomerization are estimated to be 100 s$^{-1}$ (S-to-O) and 0.01 s$^{-1}$ (O-to-S).

Solid samples were prepared in pmma films deposited on glass cover slips from CH$_2$Cl$_2$ solutions. Luminescence (441.6 nm excitation, ~28 mW, He:Cd, Liconix) was collected and dispersed using an Acton Research SpectraPro-275 Monochromator. Intensities were monitored using a Princeton Instruments diode array (Model DPDA-1024). Measurements of emission decay kinetics employed an instrument described elsewhere (Low, D. W., Winkler, J. R., Gray, H. B. *J. Am. Chem. Soc.* 1996, 118, 117–120) using 430-nm excitation from a Nd:YAG pumped OPO (Spectra Physics).

Figure 2:
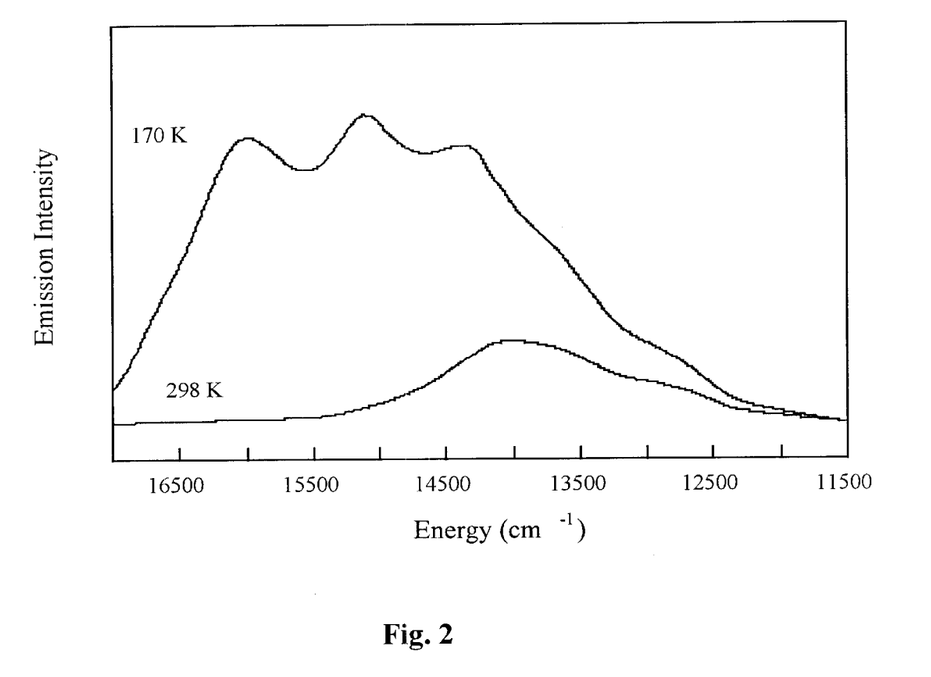
FIG. 2. Emission spectra of $[Ru(tpy)(bpy)(dmso)](SO_3CF_3)_2$ in pmma films at 298 and 170K. Emission spectra are not corrected for instrument response.

Polymethylmethacrylate films comprising [Ru(tpy)(bpy)(dmso)]$^{2+}$ were found to be luminescent at room and low temperatures (FIG. 2). At room temperature, a weak emission band is observed at 720 nm. Upon cooling the sample to 170 K, the 720-nm emission intensity increases and a new feature appears at 625 nm. Both spectra exhibit vibrational structure with peak spacings of lower energy (~900 cm$^{-1}$) than those typically observed in Ru-polypyridine complexes (~1300 cm$^{-1}$).[20] Single-crystal emission decay kinetics (135 K) reveal that the two emitting states (Em I, Em II) have different lifetimes: $\tau$I=550 ns at 720 nm; $\tau$II=100 ns at 625 nm. Interestingly, the rise time of each luminescence is within the response time of the instrument (~10 ns), suggesting that Em I and Em II form in parallel from a single precursor. The separate emission bands and lifetimes are evidence for new bonding modes of dmso.

The photoprocesses observed for [Ru(tpy)(bpy)(dmso)]$^{2+}$ (FIG. 3) are related to those reported for other Ru-polypyridine complexes.[20-27] Excitation gives an S-bonded $^1$MLCT state that rapidly converts to thermally equilibrated $^3$MLCT states, Em I and Em II. Emission from these states produces the corresponding ground states (GS I and GS II). The unusually rapid isomerization (<10 ns) probably is attributable to population of ligand-field (LF) states prior to formation of Em I and Em II. The Ru—S bond would be weakened in d$\sigma$* LF states, thereby promoting isomerization.

While the data indicates that Em I contains O-bonded Ru-dmso, the structure of Em II has not been definitively determined. As expected from its high Ru(III/II) reduction potential (E°=1.84 V), the MLCT absorption maximum for the S-bonded complex (412 nm) is substantially higher in energy than that of [Ru(bpy)3]$^{2+}$ (E°=1.25 V, $\lambda_{max}$ (abs)= 450 nm) or [Ru(tpy)$_2$]$^{2+}$ (E°=1.26 V, $\lambda_{max}$ (abs)=470 nm).[16] However, luminescence from Em II (625 nm) is not similarly blue-shifted ([Ru(bpy)3]$^{2+}$, $\lambda_{max}$ (em)=620 nm; [Ru(tpy)$_2$]$^{2+}$, $\lambda_{max}$ (em)=628 nm), implying that emission is not from the S-bonded complex. The Em II luminescence is consistent with a complex having a lower Ru(III/II) reduction potential, which is believed to be an isomer with an $\eta^2$-dmso ligand.

REFERENCES AND NOTES (1) Imlau, M.; Woike, T.; Schieder, R.; Rupp, R. A. *Phys. Rev. Lett.* 1999, 82, 2860–2863.
(2) Imlau, M.; Haussühl, S.; Woike, T.; Schieder, R.; Angelov, V.; Rupp, R. A.; Schwarz, K. *Appl. Phys. B* 1999, 68, 877–885.
(3) Woike, T.; Haussuhl, S.; Sugg, B.; Rupp, R. A.; Beckers, J.; Imlau, M.; Scheider, R. *Appl. Phys. B* 1996, 63, 243–248.
(4) Carducci, M. D.; Pressprich, M. R.; Coppens, P. *J. Am. Chem. Soc.* 1997, 119, 2669–2678.
(5) Fomitchev, D. V.; Coppens, P. *Comments Inorg. Chem.* 1999, 21, 131–148.
(6) Yeh, A.; Scott, N.; Taube, H. *Inorg. Chem.* 1982, 21, 2542–2545.
(7) Sano, M.; Taube, H. *Inorg. Chem.* 1994, 33, 705–709.
(8) Orange-yellow [Ru(tpy)(bpy)(dmso)](SO$_3$CF$_3$)$_2$ was prepared from [Ru(tpy)(bpy)(H$_2$O)](SO$_3$CF$_3$)$_2$ (0.191 g, 0.24 mmol; Takeuchi, K. J., Thompson, M. S., Pipes, D. W., Meyer, T. J. *Inorg. Chem.* 1984, 23, 1845–1851) and dimethylsulfoxide (Burdick and Jackson, 500 μL, 7 mmol) in 6 mL absolute ethanol. The reaction mixture was allowed to stir overnight at room temperature in air. The orange product was filtered and washed with cold EtOH (2×15 mL) and Et$_2$O (2×15 mL). Isolated yield: 62%.
(9) Red-orange crystals of [Ru(tpy)(bpy)(dmso)](SO$_3$CF$_3$)$_2$ were grown from acetonitrile/diethylether solutions. X-ray data were collected at 293 K on Bruker Smart 1000 diffractometer. The structure was solved by direct methods. In the final least squares refinement cycle on F$^2$, R=5.03%, R$_w$=8.88% and GOF=2.060 on 7976 reflections with 560 parameters. Crystal data: a=25.7825(17) Å, b=11.0774(7) Å, c=23.6971(16) Å,β=96.8620(10)°, V=6719.5(8) Å$^3$, space group C2/c, Z=8, MW=866.8 and ρ(calcd)=1.714 g/cm.
(10) March, F. C.; Ferguson, G. *Can. J. Chem.* 1971, 49, 3590–3595.
(11) Root, M. J.; Deutsch, E. *Inorg. Chem.* 1985, 24, 1464–1471.
(12) Senoff, C. V.; E. Maslowsky, J.; Goel, R. G. *Can. J. Chem.* 1971, 49, 3585–3589.
(13) Calligaris, M.; Carugo, O. *Coord. Chem. Rev.* 1996, 153, 83–154.
(14) Hecker, C. R.; Fanwick, P. E., McMillin, D. R. *Inorg. Chem.* 1991, 30, 659–666.
(15) E=electron transfer; C=chemical reaction: Bard, A. J., Faulkner, L. R. *Electochemical Methods. Fundamentals and Applications;* John Wiley and Sons: New York, 1980. Cyclic voltammograms were collected in a traditional two-compartment cell using a polished and sonicated 3 mm-diameter glassy carbon working electrode (BAS), Pt wire auxiliary electrode, and Ag/AgCl reference electrode. Measurements were conducted at room temperature with a CH instruments 660 electrochemical workstation. Electrochemical measurements were performed in acetonitrile, acetone, dichloromethane, and tetrahydrofuran solutions, deaerated with argon, containing 0.1 M n-tetrabutylammonium hexafluorophosphate (SACHEM). Cathodic waves corresponding to the anodic wave of the high potential couple were only observed for v>10 V/s. Scan rates from 100 V/s to 0.005 V/s were employed.
(16) Juris, A.; Balzani, V.; Barigelletti, F.; Campagna, S.; Belser, P.; Zelewsky, A. V. *Coord; Chem. Rev.* 1988, 84, 85–277.
(17) Steady-state UV-vis spectra (HP-8452) of irradiated solutions (441.6 nm) reveal two isosbestic points (365 and 432 nm) during formation of the photoproduct (λ$_{max}$ 490 nm). Reversion to the starting material is only observed in dmso (τ$_{1/2}$~8 min). Photodissociation occurs in acetonitrile. Spectra in pmma (polymethylmethacrylate, Scientific Polymer Products) films reveal the 490 nm feature following irradiation. The photoproduct is stable for hours (solution) to days (pmma films).
(18) Roecker, L.; Dobson, J. C.; Vining, W. J.; Meyer, T. J. *Inorg. Chem.* 1987, 26, 779–781.
(19) Hager, G. D.; Watts, R. J.; Crosby, G. A. *J. Am. Chem. Soc.* 1975, 97, 7037–7042.
(21) Felix, F.; Ferguson, J.; Gudel, H. U., Ludi, A. *J. Am. Chem. Soc.* 1980, 102, 4096–4102.
(22) Kober, E. M.; Meyer, T. J. *Inorg. Chem.* 1984, 23, 3877–3886.
(23) Daul, C.; Baerends, E. J.; Vernooijs, P. *Inorg. Chem.* 1994, 33, 3538–3543.
(24) Stone, M. L.; Crosby, G. A. *Chem. Phys. Lett.* 1981, 79, 169–173.
(25) Agnew, S. F.; Stone, M. L.; Crosby, G. A. *Chem. Phys. Lett* 1982, 85, 57–60.
(26) Kirchhoff, J. R.; McMillin, D. R.; Mamot, P. A.; Sauvage, J.-P. *J. Am. Chem. Soc* 1985, 107, 1138–1141.
(27) Damrauer, N. H.; Cerullo, G.; Yeh, A.; Boussie, T. R.; Shank, C. V.; McCusker, J. K. *Science* 1997, 275, 54–57.

Although the invention has been described in some detail with reference to the preferred embodiments, those of skill in the art will realize, in light of the teachings herein, that certain changes and modifications can be made without departing from the spirit and scope of the invention. Accordingly, the invention is limited only by the claims.

What is claimed is:

1. A solid photochromic photoisomerizable organometallic coordination complex having the structure wherein said complex has a ground state and at least one metastable state having different optical and/or electrical properties, wherein said metastable state can be accessed by photoexcitation, and wherein M is a metal atom capable of transferring a charge upon absorption of light;

I is an imine-containing ligand comprising at least one C=N—R$_I$ imine group and coordinated with M through the free electron pair on the imine nitrogen, wherein R$_I$ comprises a carbon, nitrogen, oxygen or hydrogen atom bound to the imine nitrogen;

L is a photoisomerizable ligand bound to M by a bond exhibiting linkage isomerism, and L is bound to the metal in the isomeric form found in the metastable state; and X$_1$, X$_2$, X$_3$ and X$_4$ are each independently selected from ligands that form a coordination complex with the metal M, said ligands being monodentate or being optionally linked or fused to each other and/or to I and/or L to form one or more didentate or terdentate ligands or a tetradentate ligand, or two of X$_1$, X$_2$, X$_3$ and X$_4$ are not present where M is tetracoordinate.

2. The complex of claim 1, wherein M is selected from the group consisting of V, Cr, Mo, W, Mn, Tc, Re, Fe, Ru, Os, Co, Rh, Ir, Ni, Pd and Pt.

3. The complex of claim 2, wherein M is selected from the group consisting of Rh, Ir, and Ni.

4. The complex of claim 2, wherein M is selected from the group consisting of Pd and Pt and two of $X_1$, $X_2$, $X_3$ and $X_4$ are not present.

5. The complex of claim 2, wherein M is selected from the group consisting of Cr, Mo, W, Mn, Re, Fe, Ru and Os.

6. The complex of claim 5, wherein M is Ru.

7. The complex of claim 1, wherein two of I, $X_1$, $X_2$, $X_3$ and $X_4$ are linked to form a didentate ligand.

8. The complex of claim 7, wherein the didentate ligand is optionally substituted bipyridyl.

9. The complex of claim 1, wherein three of I, $X_1$, $X_2$, $X_3$ and $X_4$ are linked to form a tridentate ligand.

10. The complex of claim 9, wherein the tridentate ligand is optionally substituted terpyridyl.

11. The complex of claim 1, wherein two of I, $X_1$, $X_2$, $X_3$ and $X_4$ are linked to form optionally substituted bipyridyl and the other three of I, $X_1$, $X_2$, $X_3$ and $X_4$ are linked to form optionally substituted terpyridyl.

12. The complex of claim 1 having the structure $[Ru(tpy)(bpy)(dmso)]^{2+}$.

13. A polymer comprising the complex of claim 1.

14. The complex of claim 1, wherein L comprises a functional group selected from the group consisting of S(O), $SO_2$, C(O), $CO_2$, C(S), $CS_2$, C(Se), $CSe_2$, and NO.

15. The compound of claim 14, wherein the functional group is S(O).

16. The compound of claim 14, wherein L is selected from dimethylsulfoxide, acetone, and aminoethylmethylsulfoxide.

17. A method for photoisomerizing a photoisomerizable complex, comprising:

providing a photochromic photoisomerizable organometallic coordination complex having the structure wherein said complex has a ground state and at least one metastable state having different optical and/or electrical properties, wherein said metastable state can be accessed by photoexcitation, and wherein M is a metal atom capable of transferring a charge upon absorption of light, I is an imine-containing ligand comprising at least one C=N—$R_I$ imine group and coordinated with M through the free electron pair on the imine nitrogen, wherein $R_I$ comprises a carbon, nitrogen, oxygen or hydrogen atom bound to the imine nitrogen, L is a photoisomerizable ligand bound to M by a bond exhibiting linkage isomerism, and $X_1$, $X_2$, $X_3$ and $X_4$ are each independently selected from ligands that form a coordination complex with the metal M, said ligands being monodentate or being optionally linked or fused to each other and/or to I and/or L to form one or more didentate or terdentate ligands or a tetradentate ligand, or two of $X_1$, $X_2$, $X_3$ and $X_4$ are not present where M is tetracoordinate; and contacting the ground state of the complex with a light source that photoisomerizes the bond between M and L.

18. The method of claim 17, wherein the complex is a solid.

19. The method of claim 17, wherein the complex is in solution.

20. The method of claim 17, wherein the complex is linked to a polymer.

21. The method of claim 20, wherein the complex is linked to polymethylmethacrylate.

22. The method of claim 20, wherein the complex is covalently linked to the polymer.

23. The method of claim 20, wherein the complex is entrapped in the polymer.

24. The method of claim 20, wherein the complex is coated on the surface of the polymer.

25. The method of claim 17, wherein the light source is a laser.

26. The method of claim 17, wherein the light source is polychromatic.

27. The method of claim 17, wherein the light source is monochromatic.

28. The method of claim 17, wherein the method is performed at room temperature.

29. A method for detecting entry into an area, comprising:

providing a photochromic photoisomerizable organometallic coordination complex having the structure wherein said complex has a ground state and at least one metastable state having different optical and/or electrical properties, wherein said metastable state can be accessed by photoexcitation, and wherein M is a metal atom capable of transferring a charge upon absorption of light, I is an imine-containing ligand comprising at least one C=N—$R_I$ imine group and coordinated with M through the free electron pair on the imine nitrogen, wherein $R_I$ comprises a carbon, nitrogen, oxygen or hydrogen atom bound to the imine nitrogen, L is a photoisomerizable ligand bound to M by a bond exhibiting linkage isomerism, and $X_1$, $X_2$, $X_3$ and $X_4$ are each independently selected from ligands that form a coordination complex with the metal M, said ligands being monodentate or being optionally linked or fused to each other and/or to I and/or L to form one or more didentate or terdentate ligands or a tetradentate ligand, or two of $X_1$, $X_2$, $X_3$ and $X_4$ are not present where M is tetracoordinate; and placing the ground state of the complex in the area, wherein entry into the area causes a light source to contact the complex and photoisomerize the complex from the ground state to the metastable state; and determining if said complex is in the metastable state to determine if entry into the area has occurred.

30. The method of claim 29, wherein determining if said complex is in the metastable state is performed electrically.

31. The method of claim 29, wherein determining if said complex is in the metastable state is performed optically.

32. A polymeric photoswitch comprising an organic polymer and a photochromic photoisomerizable organometallic coordination complex having the structure wherein said complex has a ground state and at least one metastable state having different optical and/or electrical properties, wherein said metastable state can be accessed by photoexcitation, and wherein M is a metal atom capable of transferring a charge upon absorption of light, I is an imine-containing ligand comprising at least one C=N—$R_I$ imine group and coordinated with M through the free electron pair on the imine nitrogen, wherein $R_I$ comprises a carbon, nitrogen, oxygen or hydrogen atom bound to the imine nitrogen, L is a photoisomerizable ligand bound to M by a bond exhibiting linkage isomerism, and $X_1$, $X_2$, $X_3$ and $X_4$ are each independently selected from ligands that form a coordination complex with the metal M, said ligands being monodentate or being optionally linked or fused to each other and/or to I and/or L to form one or more didentate or terdentate ligands or a tetradentate ligand, or two of $X_1$, $X_2$, $X_3$ and $X_4$ are not present where M is tetracoordinate.

33. The photoswitch of claim 32, wherein the complex is mixed in solution with monomers prior to polymerization of the monomers to form the polymer, thereby entrapping the complex within the polymer.

34. The photoswitch of claim 32, wherein the complex is substituted with a polymerizable moiety which is incorporated into the polymer during polymerization.

35. An organic light-emitting diode comprising:
first and second electrodes; and
a conjugated polymer layer comprising a semiconducting organic polymer and the complex of claim 1 and/or its ground state, said conjugated polymer layer electrically connected with said first and second electrodes.

36. The diode of claim 35, wherein the first and second electrodes are transparent.

37. A solar cell comprising a front contact, a back contact, and a photovoltaic layer electrically connected with the front contact and the back contact, the photovoltaic layer comprising the complex of claim 1 and/or its ground state.

38. The solar cell of claim 37, wherein the solar cell is doped with an electron-accepting molecule.

39. The solar cell of claim 38, wherein the solar cell is doped with a halide or mixture of halides.

40. The solar cell of claim 37, wherein the front contact comprises indium-tin-oxide.

41. The solar cell of claim 37, wherein the back contact comprises indium-tin-oxide.

42. The method of claim 17, wherein said photoisomerizing is used to store a bit of information.

43. A method for detecting exposure of a test sample to elevated temperature, comprising:
providing a test sample;
providing a reporter comprising a photochromic photoisomerizable organometallic coordination complex having the structure wherein said complex has a ground state and at least one metastable state having different optical and/or electrical properties, wherein said metastable state can be accessed by photoexcitation, and wherein M is a metal atom capable of transferring a charge upon absorption of light, I is an imine-containing ligand comprising at least one C=N—$R_I$ imine group and coordinated with M through the free electron pair on the imine nitrogen, wherein $R_I$ comprises a carbon, nitrogen, oxygen or hydrogen atom bound to the imine nitrogen, L is a photoisomerizable ligand bound to M by a bond exhibiting linkage isomerism, and $X_1$, $X_2$, $X_3$ and $X_4$ are each independently selected from ligands that form a coordination complex with the metal M, said ligands being monodentate or being optionally linked or fused to each other and/or to I and/or L to form one or more didentate or terdentate ligands or a tetradentate ligand, or two of $X_1$, $X_2$, $X_3$ and $X_4$ are not present where M is tetracoordinate, wherein a detectable amount of the complex is in the metastable state;

electrically and/or optically determining the extent to which the complex in the reporter is in the metastable state;

storing the test sample with the reporter; and electrically and/or optically determining the extent to which the complex in the reporter is in the metastable state after said storing to determine if the complex has decayed to the ground state at an accelerated rate.

* * * * *